United States Patent
Hsu

(10) Patent No.: US 7,952,106 B2
(45) Date of Patent: May 31, 2011

(54) LIGHT EMITTING DIODE DEVICE HAVING UNIFORM CURRENT DISTRIBUTION AND METHOD FOR FORMING THE SAME

(75) Inventor: Chin-Yuan Hsu, Kaohsiung (TW)

(73) Assignee: Everlight Electronics Co., Ltd., Taipei (TW)

( * ) Notice: Subject to any disclaimer, the term of this patent is extended or adjusted under 35 U.S.C. 154(b) by 0 days.

(21) Appl. No.: 12/422,027

(22) Filed: Apr. 10, 2009

(65) Prior Publication Data

US 2010/0258835 A1  Oct. 14, 2010

(51) Int. Cl.
| | |
|---|---|
| H01L 27/15 | (2006.01) |
| H01L 29/26 | (2006.01) |
| H01L 31/12 | (2006.01) |
| H01L 33/00 | (2006.01) |
| H01L 29/06 | (2006.01) |
| H01L 31/0328 | (2006.01) |
| H01L 31/0336 | (2006.01) |
| H01L 31/072 | (2006.01) |
| H01L 31/109 | (2006.01) |
| H01L 29/205 | (2006.01) |
| H01L 29/22 | (2006.01) |
| H01L 31/00 | (2006.01) |

(52) U.S. Cl. ............... 257/79; 257/13; 257/91; 257/94; 257/98; 257/99; 257/448; 257/E33.062

(58) Field of Classification Search ............ 257/13, 257/79, 91, 94, 99, 448, 457, E33.062, 98
See application file for complete search history.

(56) References Cited

U.S. PATENT DOCUMENTS

| | | | | |
|---|---|---|---|---|
| 4,828,364 A | * | 5/1989 | Saito et al. | 349/110 |
| 5,101,099 A | * | 3/1992 | Funada et al. | 250/208.1 |
| 5,315,100 A | * | 5/1994 | Kobayashi et al. | 250/208.1 |
| 5,461,246 A | * | 10/1995 | Chou | 257/449 |

(Continued)

FOREIGN PATENT DOCUMENTS

DE  10 2007 003 A1  7/2008

(Continued)

OTHER PUBLICATIONS

Communication and European Search Report issued by the European Patent Office in European Patent Application No. 09165401.2, mailed Dec. 21, 2010, 6 pages.

(Continued)

*Primary Examiner* — Ida M Soward
(74) *Attorney, Agent, or Firm* — Finnegan, Henderson, Farabow, Garrett & Dunner, L.L.P.

(57) ABSTRACT

A semiconductor is disclosed. The semiconductor may include a transparent layer having a first surface. The semiconductor may further include a first doped layer formed over the first surface of the transparent layer. The first doped layer may have a plurality of first-type metal electrodes formed thereon. The semiconductor may further include a second doped layer formed over the first surface of the transparent layer. The second doped layer may have a plurality of second-type metal electrodes formed thereon. The semiconductor may also include an active layer formed over the first surface of the transparent layer and disposed between the first doped layer and the second doped layer. The first-type metal electrodes and the second-type metal electrodes may be alternately arranged and the distances between each first-type metal electrode and its adjacent second-type metal electrodes may be substantially equal.

20 Claims, 6 Drawing Sheets

U.S. PATENT DOCUMENTS

| | | | |
|---|---|---|---|
| 5,512,763 A * | 4/1996 | Allam | 257/21 |
| 5,631,490 A * | 5/1997 | Dutta et al. | 257/457 |
| 5,804,918 A * | 9/1998 | Yazawa et al. | 313/506 |
| 6,486,499 B1 | 11/2002 | Krames et al. | |
| 6,621,105 B2 * | 9/2003 | Taninaka et al. | 257/88 |
| 6,633,122 B2 * | 10/2003 | Kijima et al. | 313/506 |
| 6,818,328 B2 * | 11/2004 | Utsumi et al. | 428/690 |
| 6,943,389 B2 * | 9/2005 | Yamaguchi et al. | 257/229 |
| 7,193,245 B2 * | 3/2007 | Zhao et al. | 257/91 |
| 7,217,947 B2 * | 5/2007 | Clarke et al. | 257/14 |
| 7,259,447 B2 | 8/2007 | Kong et al. | |
| 7,446,472 B2 * | 11/2008 | Matsukaze | 313/506 |
| 7,659,594 B1 * | 2/2010 | Liou | 257/448 |
| 7,683,374 B2 * | 3/2010 | Lin et al. | 257/69 |
| 2004/0164669 A1 * | 8/2004 | Kawaguchi et al. | 313/501 |
| 2005/0156177 A1 | 7/2005 | Lin et al. | |
| 2006/0223214 A1 * | 10/2006 | Rieve et al. | 438/48 |
| 2007/0096130 A1 | 5/2007 | Schiaffino et al. | |
| 2008/0008964 A1 * | 1/2008 | Chan et al. | 430/270.13 |
| 2008/0135867 A1 * | 6/2008 | Feng et al. | 257/99 |
| 2008/0190479 A1 * | 8/2008 | Hsieh et al. | 136/246 |
| 2009/0146178 A1 * | 6/2009 | Miyachi et al. | 257/184 |
| 2009/0200568 A1 * | 8/2009 | Horie | 257/98 |

FOREIGN PATENT DOCUMENTS

| | | |
|---|---|---|
| JP | 58-176938 | 10/1983 |
| WO | WO 2009/075551 A2 | 6/2009 |

OTHER PUBLICATIONS

*Lumileds Luxeon K2 Led Lamp Teardown and Technology Analysis*, MuAnalysis, 2008, pp. 1-10.

*Lumileds Luxeon K2 Power Light Source*, 2008 Philips Lumileds Lighting Company, Jun. 2008, pp. 1-42.

* cited by examiner

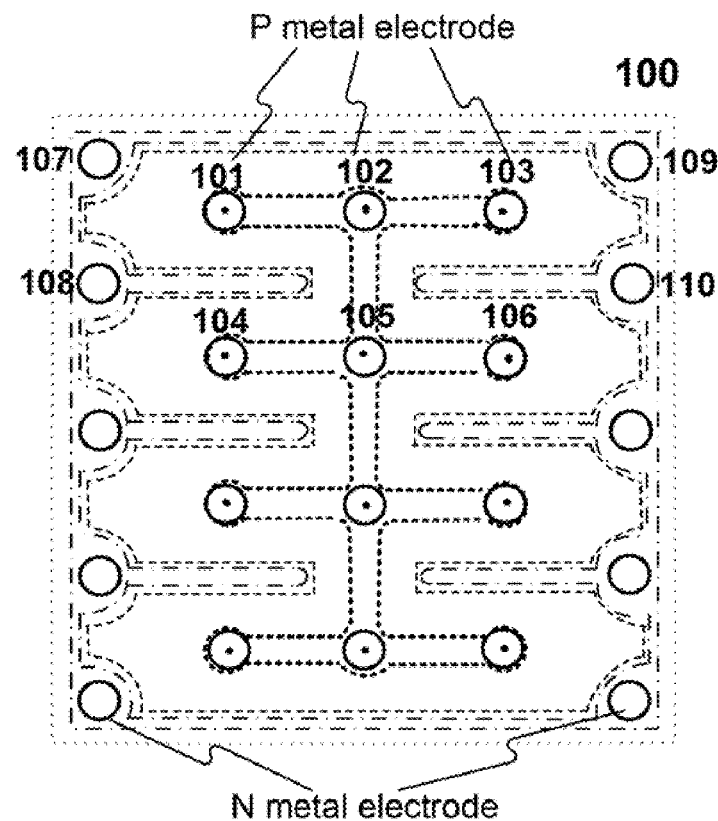
Prior Art Fig. 1
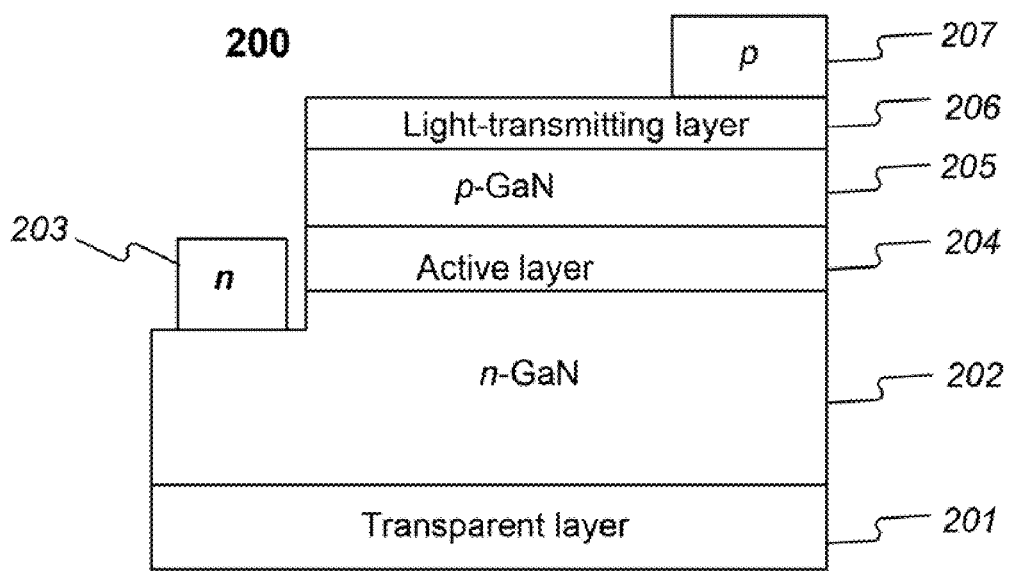
Fig. 2

US 7,952,106 B2

LIGHT EMITTING DIODE DEVICE HAVING UNIFORM CURRENT DISTRIBUTION AND METHOD FOR FORMING THE SAME

TECHNICAL FIELD

The present disclosure relates generally to a light emitting diode (LED) device, and relates more particularly to an LED device with a generally uniform electrode distribution and a method for forming the same.

BACKGROUND

LED devices have been widely used as low-energy replacements for traditional light sources. In particular, with the development of gallium nitride (GaN) LEDs that emit high illumination of a blue/green light, the fall-color LED display, white light LED, and LED's for traffic signals have all been introduced into the market. However, compared with traditional light sources, LED devices require more precise current and heat management. For example, the low thermal conductivity of sapphire usually creates high serial thermal resistance in an LED device.

Flip-chip LED devices are developed to improve the heat dissipation and current diffusion of conventional LED devices. For example, flip-chip LED devices may include a surface mount substrate, such as a silicon substrate, to improve thermal conductivity, especially in high power applications. In addition, layout of LED dies in flip-chip LED devices is usually designed to improve current diffusion and distribution. For example, the layout of the LED dies is designed such that patterned metal lines of p-electrodes and n-electrodes are utilized for conducting current. Furthermore, the p-electrodes and n-electrodes are usually disposed around the lateral surfaces of the LED dies, or both p-electrodes and n-electrodes are disposed in a common area.

FIG. 1 shows a layout of p-electrodes and n-electrodes in a conventional LED device 100, according to a conventional design. LED device 100 may include multiple p-electrodes and n-electrodes arranged in lines. For example, as shown in FIG. 1, LED device 100 may include two lines of n-electrodes at the left and right edges respectively, and three lines of p-electrodes in between. The p-electrodes and n-electrodes are arranged alternately such that each p-electrode (e.g., p-electrode 101) is on a central line between two adjacent n-electrodes, e.g., n-electrodes 107 and 108 and each n-electrode (e.g., n-electrode 108) is on a central line between two adjacent p-electrodes (e.g., p-electrodes 101 and 104). However, the distances between the closest p-electrodes and the n-electrodes are not constant. For example, the distance between p-electrode 101 and n-electrode 107 is different from the distance between p-electrode 101 and n-electrode 109 or 110. Further, the distance between n-electrode 108 and p-electrode 104 is different from the distance between n-electrode 108 and p-electrode 105 or 106.

Although LED device 100 as shown in FIG. 1 may effectively improve the current and heat management compared to conventional LED devices, it may nevertheless be sub-optimal. For example, due to the non-uniform distances, the paths of applied current distributed within LED device 100 have different lengths, and the intervals between the electron current paths are also different. Consequently, the internal serial resistances along the current paths are different. Therefore, different potential differences may be formed at different electrode pairs and non-uniform current distributions will occur in LED device 100. For example, the electrode pair 101-104 may have a different potential difference from the electrode pair 101-105. Such current diffusion difficulty and distribution non-uniformity may cause reduction in brightness and light emission efficiency of GaN blue or green LEDs.

Forming a transparent current diffusion layer on the top surface of a p-GaN layer may improve the current distribution in an LED device to some extent. With such a structure, the current may inject into the current diffusion layer after passing through the metal electrode. However, the current density in the area under the metal electrode remains higher than that under the current diffusion layer, and most current fluxes jam in the area under the metal electrode. Therefore, there is a need to further improve the contact resistances between the current diffusion layer and p-GaN layer.

The apparatus and method of the present disclosure are directed towards overcoming one or more of the constraints set forth above.

SUMMARY

In one aspect, the present disclosure is directed to a semiconductor. The semiconductor may include a transparent layer having a first surface. The semiconductor may further include a first doped layer formed over the first surface of the transparent layer. The first doped layer may have a plurality of first-type metal electrodes formed thereon. The semiconductor may further include a second doped layer formed over the first surface of the transparent layer. The second doped layer may have a plurality of second-type metal electrodes formed thereon. The semiconductor may also include an active layer formed over the first surface of the transparent layer and disposed between the first doped layer and the second doped layer. The first-type metal electrodes and the second-type metal electrodes may be alternately arranged and the distances between each first-type metal electrode and its adjacent second-type metal electrodes may be substantially equal.

In another aspect, the present disclosure is directed to a flip-chip light emitting diode (LED) package structure. The flip-chip LED package structure may include a package substrate, and an LED device. The LED device may include a transparent layer having a first surface and a second surface opposite to the first surface. The LED device may further include a first doped layer formed over the first surface of the transparent layer. The first doped layer may have a plurality of first-type metal electrodes formed thereon. The LED device may further include a second doped layer formed over the first surface of the transparent layer. The second doped layer may have a plurality of second-type metal electrodes formed thereon. The LED may also include an active layer formed over the first surface of the transparent layer and disposed between the first doped layer and the second doped layer. The first-type metal electrodes and the second-type metal electrodes may be alternately arranged and the distances between each first-type metal electrode and its adjacent second-type metal electrodes may be substantially equal. The LED device may be faced-down and flipped on the package substrate with the second surface of the transparent layer facing away from the package substrate. The LED device may be electrically connected to the package substrate through the first-type metal electrodes and the second-type metal electrodes.

In yet another aspect, the present disclosure is directed to a method for forming a semiconductor. The method may include providing a transparent layer having a first surface. The method may further include forming a first doped layer over the first surface of the transparent layer. The first doped layer may have a plurality of first-type metal electrodes formed thereon. The method may further include forming an active layer over the first surface of the transparent layer. The method may also include forming a second doped layer over the first surface of the transparent layer. The second doped layer may have a plurality of second-type metal electrodes formed thereon. The first-type metal electrodes and the second-type metal electrodes may be alternately arranged and the distances between each first-type metal electrode and its adjacent second-type metal electrodes may be substantially equal.

BRIEF DESCRIPTION OF THE DRAWINGS

FIG. 1 shows a layout of p-electrodes and n-electrodes in a conventional LED device, according to a conventional design;

FIG. 2 shows a cross-section view of an LED die, according to an exemplary embodiment of the present disclosure;

Figure 3:
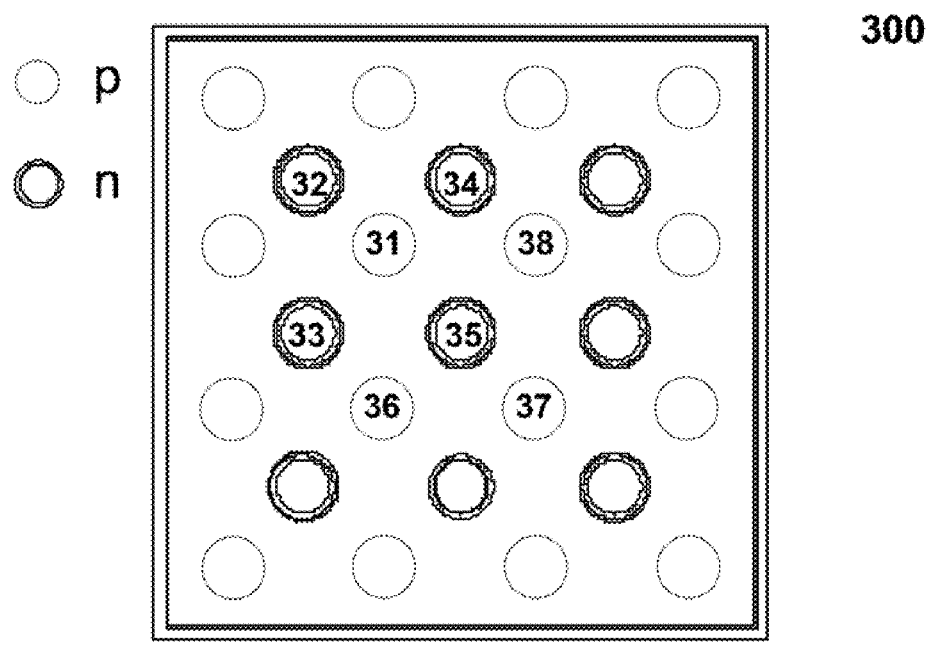
FIG. 3 shows a layout of LED dies in a semiconductor, according to an exemplary embodiment of the present disclosure.

To the extent that any of the above figures note dimensions, these dimensions are for illustrative purposes only and do not serve to limit the scope of the invention.

DETAILED DESCRIPTION

Reference will now be made in detail to various embodiments, which are illustrated in the accompanying drawings. Wherever possible, the same reference numbers will be used throughout the drawings to refer to the same or like parts.

FIG. 2 shows a cross-section view of an LED die 200, according to an exemplary embodiment of the present disclosure. LED die 200 may include, among other things, a transparent layer 201, an n-type doped layer 202, an n-electrode 203, an active layer 204, a p-type doped layer 205, a light-transmitting layer 206, and a p-electrode 207. Transparent layer 201 can be a conducting or non-conducting substrate. Transparent layer 201 may include materials that have high refractive indices such that light will be reflected back into the material at the material/air surface interface. In some embodiments, the material of transparent layer 201 may be selected from a group consisting of silicon, silicon carbide, sapphire, arsenide, phosphide, zinc oxide (ZnO), and magnesium oxide. For example, GaN/InGaN LEDs may use a sapphire substrate.

N-type doped layer 202, active layer 204, p-type doped layer 205, and light-transmitting layer 206 may be formed, for example, by performing a series of epitaxy processes sequentially on transparent layer 201. The material of n-type doped layer 202 and p-type doped layer may comprise a III-V group compound of semiconductor material, for example, an indium-containing nitride (such as InGaN) semiconductor, an aluminum-containing nitride (such as AlGaN) semiconductor, or a gallium-containing nitride (Such as GaN) semiconductor. For example, blue LEDs are usually based on the wide band-gap semiconductors GaN and InGaN. N-electrode 203 may be a piece of n metal electrically connected with n-type doped layer 202. Similarly, p-electrode 207 may be a piece of p metal electrically connected with p-type doped layer 205.

The active layer 204 may include, for example, a single or a multi-quantum well structure to enhance the light emitting efficiency. The one or more InGaN quantum wells may be positioned between n-type doped layer 202 and p-type doped layer 205. In some embodiments, by varying the relative InN—GaN fraction in the InGaN quantum wells, the light emission can be varied from, for example, violet to amber. For example, Green LEDs may be manufactured from the InGaN—GaN system.

Light-transmitting layer 206 may be formed between p-type doped layer 205 and p-electrode 207. In some embodiments, a material of the light-transmitting layer 206 may include an indium tin oxide (ITO), but also may include for example, materials such as ITO, CTO, IZO, ZnO:Al, $ZnGa_2O_4$, $SnO_2$:Sb, $Ga_2O_3$:Sn, $AgInO_2$:Sn, $In_2O_3$:Zn, $CuAlO_2$, LaCuOS, NiO, $CuGaO_2$, $SrCu_2O_2$, or other transparent conductive material having similar properties.

In some embodiments, multiple LED dies 200 may be formed on a common transparent layer 201, and arranged to form a certain pattern. FIG. 3 shows a layout of LED dies in a semiconductor 300, according to an exemplary embodiment of the present disclosure. As shown in FIG. 3, the LED dies are arranged such that the p-electrodes and n-electrodes are disposed on semiconductor 300 in an alternating manner. Each p-electrode (e.g., p-electrode 31) is in the center of four adjacent n-electrodes (e.g., n-electrodes 32-35), and each n-electrode (e.g., n-electrode 35) is on a central line between two adjacent p-electrodes (e.g., p-electrodes 31, and 36-38). Therefore, the distances between each p-electrode and its closest n-electrodes are about the same, and the distances between each n-electrode and its closest p-electrode are also about the same. For example, the distance between p-electrode 31 and each of n-electrodes 32-35 is about the same.

Furthermore, as shown in FIG. 3, the distances between every two adjacent p-electrodes are about the same, as well as the distances between every two adjacent n-electrodes. For example, the distance between p-electrodes 31 and 36 is about the same as the distance between p-electrodes 31 and 38. Similarly, the distance between n-electrodes 32 and 33 is about the same as the distance between n-electrodes 32 and 34. In some embodiments, as long as the p-electrodes and n-electrodes are about equal-distanced, as shown in FIG. 3, the locations of the p-electrodes and n-electrodes can be interchanged.

Figure 4:
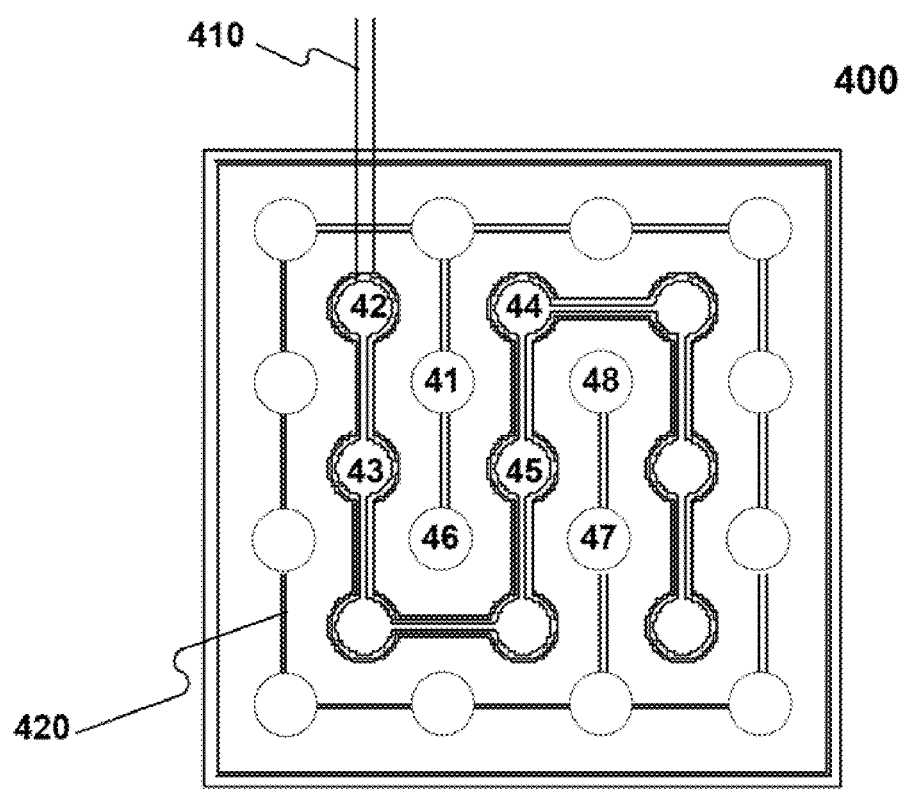
FIG. 4 shows a layout of LED dies in a wire-bonding semiconductor, according to an exemplary embodiment of the present disclosure.

FIG. 4 shows a layout of LED dies in a wire-bonding semiconductor 400, according to an exemplary embodiment of the present disclosure. As shown in FIG. 4, wire-bonding semiconductor 400 may also include multiple LED dies arranged in an alternating manner as in FIG. 3. In addition, wire-bonding semiconductor 400 may further include a first patterned metal line 410 connecting the p-electrodes, and a second patterned metal line 420 connecting the n-electrodes. In some embodiments, first patterned metal line 410 may comprise metal material the same as in the n-electrodes, and electrically connect two or more n-electrodes (such as n-electrodes 42-45). Similarly, second patterned metal line 420 may comprise metal material the same as in the p-electrodes, and electrically connect two or more p-electrodes (such as p-electrodes 41 and 46-48). Although in FIG. 3 and FIG. 4, the distances between p-electrodes and n-electrodes are illustrated as equal, it is contemplated that in practice the distances may be about equal with small variations.

Figure 5:
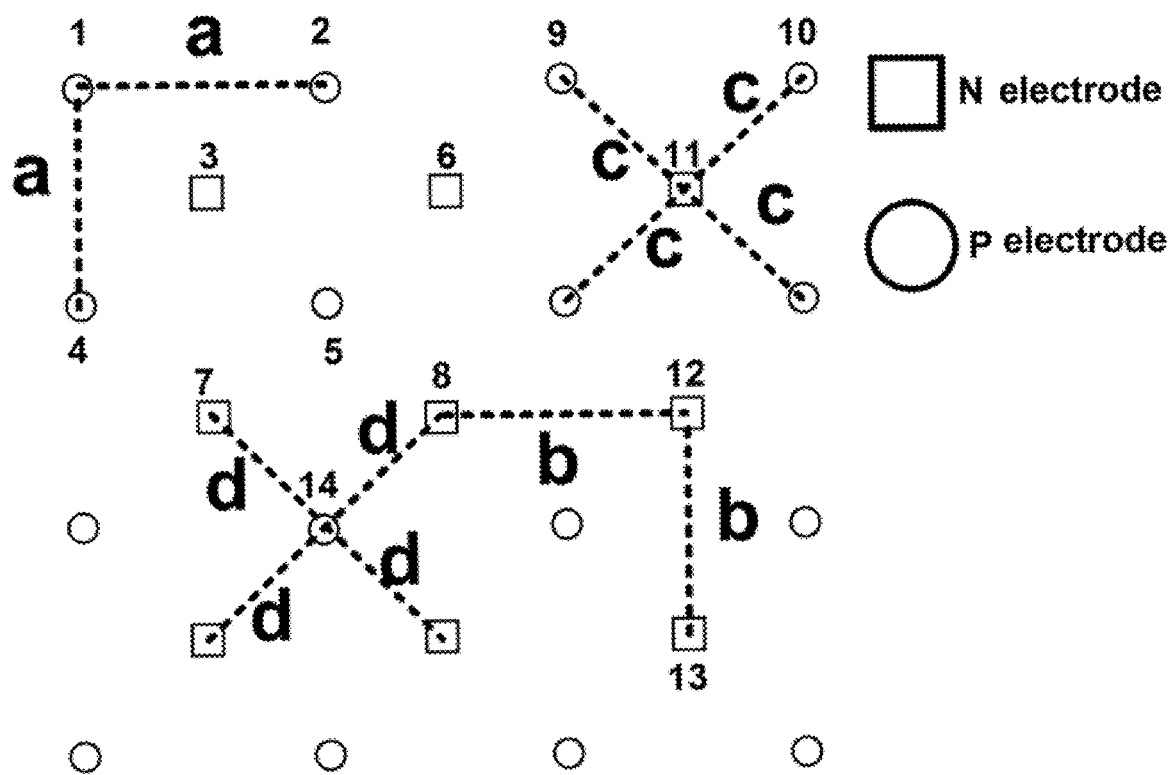
FIG. 5 shows a distribution of p-electrodes and n-electrodes in a semiconductor comprising multiple LED dies, consistent with the disclosed embodiments shown in FIGS. 3 and 4.

FIG. 5 shows a distribution of p-electrodes and n-electrodes in a semiconductor comprising multiple LED dies, consistent with the disclosed embodiments shown in FIGS. 3 and 4. As shown in FIG. 5, p-electrodes and n-electrodes are arranged alternately with about equal distances between each p-n electrode pair. Accordingly, an equivalent circuit may be formed by the equivalent potential based on the constant potential difference between each p electrode and each n electrode that forms a p-n pair.

For example, as shown in FIG. 5, a represents the distance between every two adjacent p-electrodes (such as between p-electrodes 1 and 2, as well as p-electrodes 1 and 4) and b represents the interval between two adjacent n metal electrodes (such as between n-electrodes 12 and 8, as well as p-electrodes 12 and 13). c and d represent the distances between adjacent p and n metal electrodes. For example, c represents the distance between each p-electrode (such as p-electrode 5) and the four n-electrodes (such as n-electrodes 3 and 6-8) surrounding it. d represents the distance between each n-electrode (such as n-electrode 3) and the four p-electrodes (such as p-electrodes 1, 2, 4 and 5) surrounding it.

Consistent with the embodiments disclosed in FIG. 3 and FIG. 4, a is designed to be about equal to b, and c is designed to be about equal to d.

Based on the electrodes arrangement, semiconductors 300 and 400 can be seen as an assembly of numerous parallel sub-dies, where each p-electrode has an approximately equal potential and each n-electrode also has an approximately equal potential. That is, $V_1=V_2=V_4=V_5=C_p$, and $V_3=V_6=V_7=V_8=C_n$, where $C_p$ is a constant voltage for the p-electrodes and $C_n$ is a constant voltage potential for the n-electrodes. Accordingly, the potential difference between each p-n electrode pair becomes a constant value $\Delta V=V_1-V_3=V_2-V_3=V_4-V_3=V_5-V_3=V_5-V_6=V_5-V_7=V_5-V_8$. It is contemplated that in embodiments where the distances between p-electrodes and n-electrodes are substantially equal with small variations, the voltage potential for the p-electrodes, voltage potential for the n-electrodes, as well as the potential difference between each p-n electrode pair may be substantially constant with small variations.

Figure 6A:
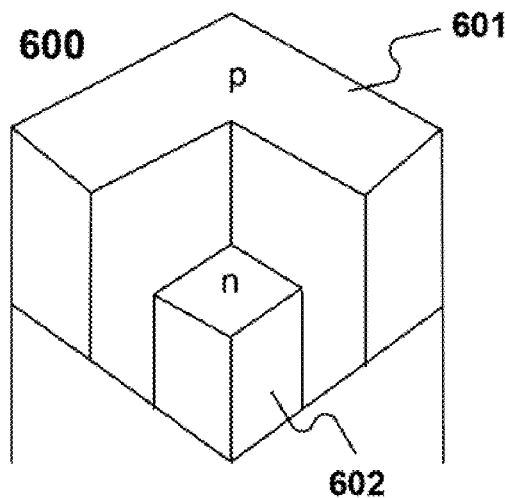
FIG. 6A shows an LED structure, according to a conventional design.
Figure 6B:
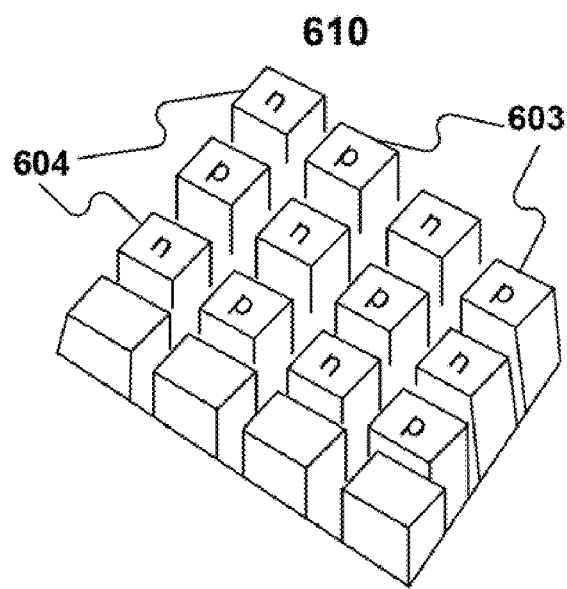
FIG. 6B shows an LED structure, according to an exemplary embodiment of the present disclosure.

FIG. 6A shows an LED structure 600 according to a conventional design, as contrasted with FIG. 6B that shows an LED structure 610 according to an exemplary embodiment of the present disclosure. As shown in FIG. 6A, in prior art LED structure 600, p-electrode 601 is of a different thickness and occupies a different area as n-electrode 602. As a result, LED structure 600 may have a higher cracking possibility and a higher heat stress. In comparison, as shown in FIG. 6A, LED structure 610 consistent with the present disclosure include p-electrodes 603 and n-electrodes 604 that are of substantially the same thickness and occupy substantially the same areas. Furthermore, each electrode of LED structure 610 is smaller in volume than that of LED structure 600. Consequently, heat stress and cracking possibility may be reduced, and LED structure 610 may have more flexibility in various design applications.

Figure 7:
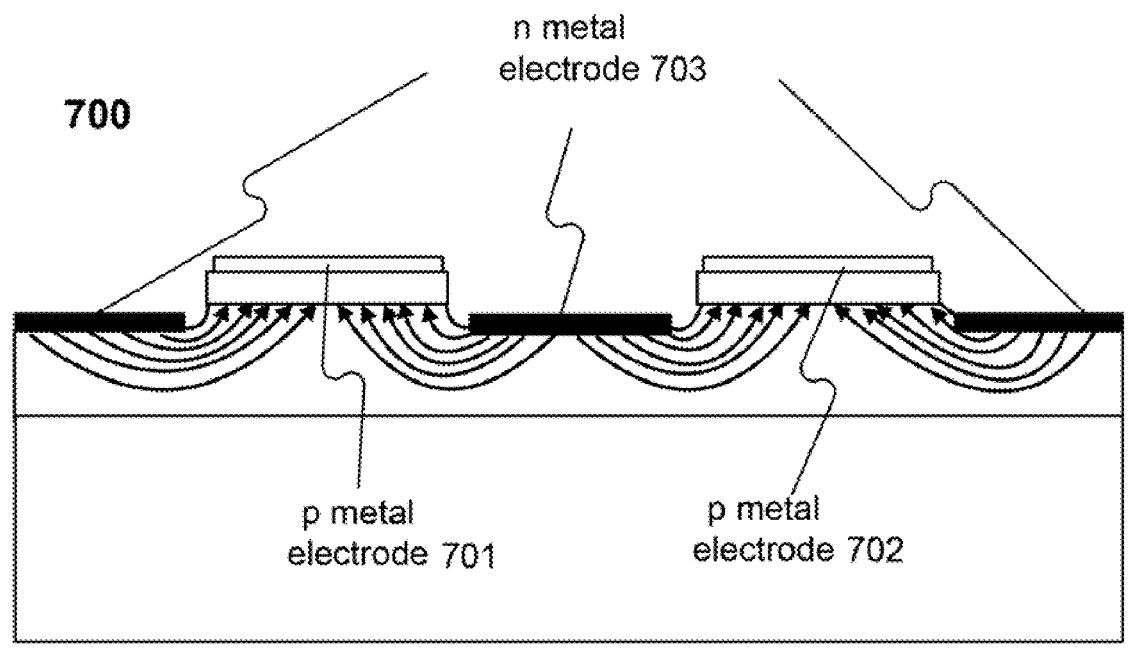
FIG. 7 shows a distribution of electron current in a semiconductor, consistent with the disclosed embodiments shown in FIG. 5 and FIG. 6B.

FIG. 7 shows a distribution of electron current in a semiconductor 700, consistent with the disclosed embodiments shown in FIG. 5 and FIG. 6B. As shown in FIG. 7, with the about equal potential distributions of p-electrodes (701 and 702) and n-electrodes (703) consistent with FIG. 5, and the structural design consistent with FIG. 6B, the current flow can pass through the LED die from a single input point to a single output point. Therefore, the potential difference between the p and n electrodes can be secured, and the current may more uniformly distribute and disperse in each p-n junction formed between each p-n electrode pair. For example, the current paths between p-electrode 701 and n-electrode 703, as well as p-electrode 702 and n-electrode 703, distribute more uniformly under each of electrodes 701-703. Consequently, the light emission efficiency of the LED dies may be improved.

Figure 8:
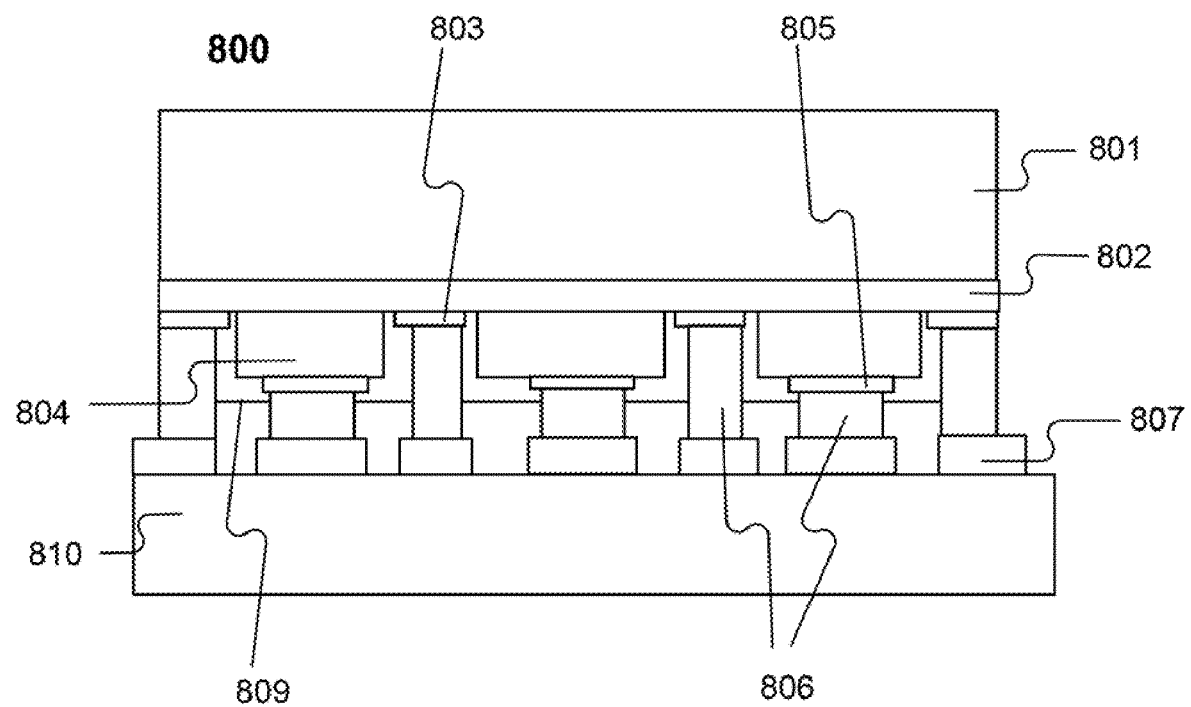
FIG. 8 shows a cross-section view of a flip-chip LED device, according to an exemplary embodiment of the present disclosure.

The layout LED dies as shown in FIG. 3 may be applied in forming a flip-chip LED package structure. FIG. 8 shows a cross-section view of a flip-chip LED device 800, according to an exemplary embodiment of the present disclosure. Flip-chip LED device 800 may include, among other things, a semiconductor 300 as disclosed in FIG. 3 consisting of a transparent layer 801, a n-type doped layer 802, a plurality of n-electrodes 803, a p-type doped layer 804, a plurality of p-electrodes 805. In some embodiments, flip-chip LED device may further include a active layer (not shown) located between the n-type doped layer 802 and the p-type doped layer 804. Flip-chip LED device 800 may further include a package substrate 810, a metal bump layer 806 including a plurality of metal bumps, a pad layer 807, and a passivation layer 809.

In some embodiments, semiconductor 300 including LED dies of FIG. 2 may be faced-down and flipped over package substrate 810 such that the plurality of n-electrodes 803 and the plurality of p-electrodes 805 are facing package substrate 810, and transparent layer 801 is facing away from package substrate 810. Transparent layer 801 may include, for example, a silicon carbide, a sapphire, a GaN and a AlGaInN substrate. The package substrate 810, for example, may include but not limited, ceramic substrate, $Al_2O_3$ substrate, AlN substrate, and silicon substrate.

Semiconductor 300 and package substrate 810 are electrically connected via metal bump layer 806 and pad layer 807. For example, as shown in FIG. 8, the plurality of n-electrodes 803 are electrically connected to package substrate 810 via a plurality of metal bumps. The plurality of p-electrodes 805 are electrically connected to package substrate 810 via a plurality of metal bumps and gold or other types of eutectic stud bumps. Consistent with the disclosed embodiments, metal bump layer 806 and pad layer 807 may also be used in the flip-chip LED package structure 800 as current conduction paths and heat dissipation paths to further improve the reliability of the LED device. In some embodiments, flip-chip LED package structure 800 may also include a passivation layer 809 formed on n-type doped layer 802.

Figure 9:
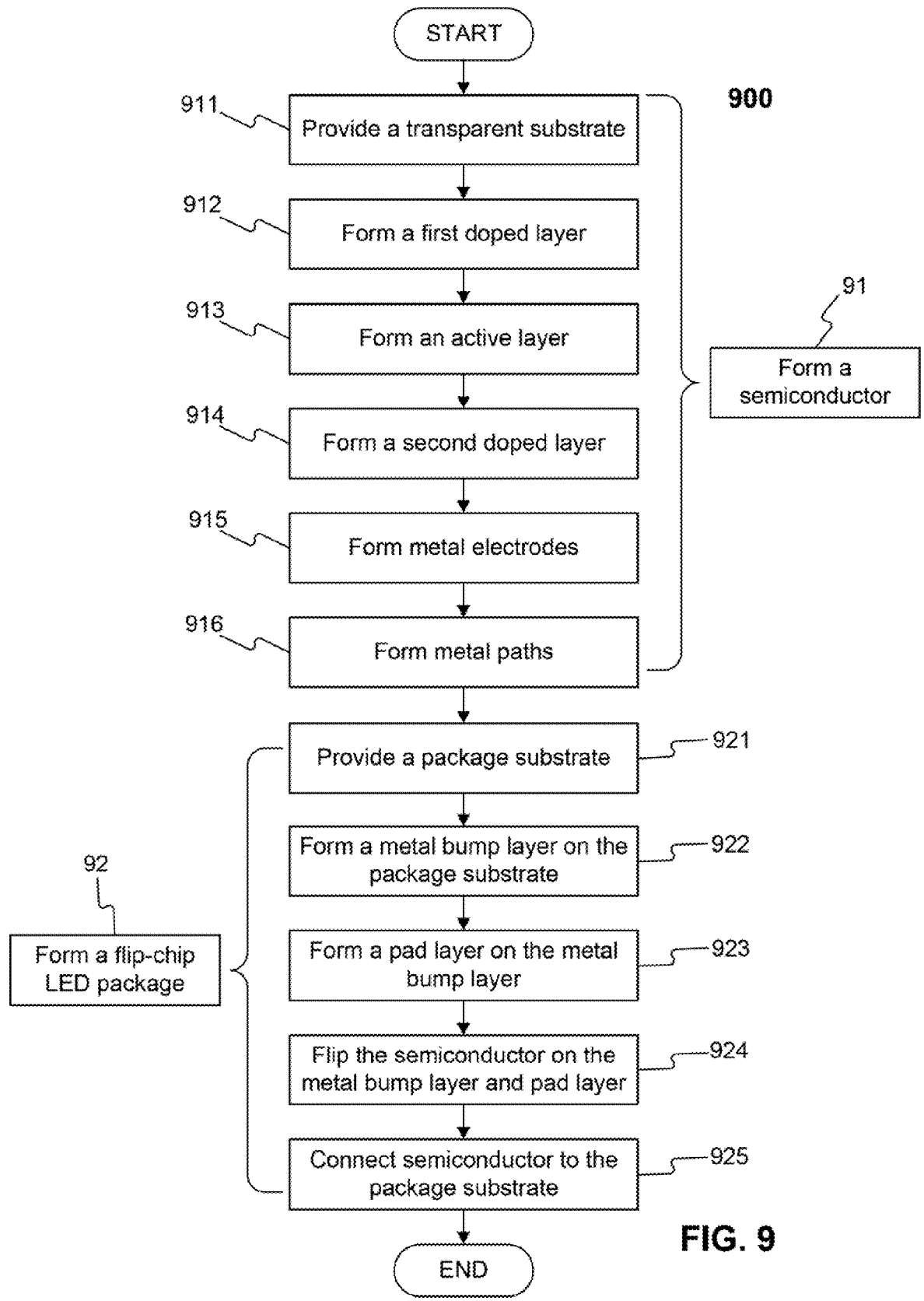
FIG. 9 is a flow chart of an exemplary operation process for forming a semiconductor and a flip-chip LED device, consistent with the disclosed embodiments shown in FIGS. 2-4.

FIG. 9 is a flow chart of an exemplary operation process 900 for forming a semiconductor 300 and a flip-chip LED device 800, consistent with the disclosed embodiments shown in FIGS. 2-4. In some embodiments, process 900 may include a sub-process 91 for forming semiconductor 300 and a sub-process 92 for forming flip-chip LED device 800. Although sub-process 91 and sub-process 92 are described collectively in connection with process 900, it is contemplated that each of the sub-processes may be performed separately and independently from each other.

Process 900 may start with providing a transparent layer 201 (stage 911). In stage 912, a first doped layer, such as a n-type doped layer 202, may be formed on transparent layer 201. In stage 913, an active layer 204 having multi-quantum wells may be formed on the first doped layer. In stage 914, a second doped layer, such as a p-type doped layer 205, may be formed on active layer 204. Consistent with some embodiments, stages 911-914 may use materials that have high refractive indices such that much light will be reflected back into the material at the material/air surface interface. In some embodiments, stages 911-914 may be performed by epitaxy processes.

In stage 915, metal electrodes are formed on the respective doped layers. For example, n-electrodes are formed on n-type doped layer 202 and p-electrodes are formed on p-type doped layer 205. In some embodiments, following stages 911-915, a portion of the n-type doped layer 202, a portion of the active layer 204 and a portion of the p-type doped layer 205 are removed, for example but not limited to, by etching or by another method. Therefore, each of the layers 202, 204, and 205 are patterned to form a plurality of isolated island structure. Consistent with some embodiments, in the isolated island structure above, a portion of the p-type doped layer 205, active layer 204 and a portion of n-type doped layer 202 are removed, such that the n-electrodes are electrically connected with n-type doped layer 202 and the p-electrodes are electrically connected with p-type doped layer 205.

Consistent with embodiments of the present disclosure, the p-electrodes and n-electrodes are formed in an alternating manner such that the distances between each p-electrode and its adjacent n-electrodes are substantially constant. The distances between every two adjacent p-electrodes, as well as every two adjacent n-electrodes, are also substantially constant. In some embodiments, a line of p-electrodes may be formed first, and a line of n-electrodes may be formed next to the p-electrodes. Each n-electrode may be formed on a central line of two adjacent p-electrodes and the vertical distance between the n-electrodes to the line across the p-electrodes may be set as half of the distance between every two adjacent p-electrodes. Then another line of p-electrodes may be formed next to the line of n-electrodes, where the distance between the new line of p-electrodes and the first line of p-electrodes may be substantially equal to the distance between every two adjacent p-electrodes.

Consistent with some embodiments, such as the embodiment disclosed in connection with FIG. 4, one or more metal paths may be formed to electrically connect the p-electrodes or the n-electrodes (stage 916). Stage 916 may be optional in performing process 900. For example, semiconductor 300 may be formed without stage 916, and semiconductor 400 may be formed with stage 916. After stage 916, sub-process 91 may conclude.

Sub-process 92 may start with providing a package substrate 810 (stage 921). In stage 922, metal bump layer 806 having a plurality of metal bumps may be formed on package substrate 810. In stage 923, pad layer 807 having a plurality of gold bud bumps may be selectively formed on metal bump layer 806. Therefore, an insulating material is filled between layers 802, 803, 804, 805 and 806 to form a passivation layer 809.

In stage 924, the semiconductor formed by stages 911-915 may be flipped on metal bump layer 806 and pad layer 807, with the electrodes facing package substrate 810 and transparent layer 201 facing away from package substrate 810. In stage 925, the semiconductor may be electrically connected to package substrate 810. Consistent with some embodiments, the p-electrodes and n-electrodes may be electrically connected to package substrate 810 via metal bump layer 806 and pad layer 807. After stage 925, sub-process 92 as well as process 900 may conclude.

INDUSTRIAL APPLICABILITY

The scope of the invention is not intended to be limited to the above embodiments. For example, although the disclosed embodiments are described in association with GaN based blue or green LEDs (or UV-LED based purple) and GaN based flip-chip LED package structures, the disclosed semiconductor and method for forming the semiconductor may be used on any other type of LED devices known in the art that include multiple LED dies. Furthermore, the disclosed semiconductor can also be used for forming LED package structures other than flip-chip package structure for improving the current distribution and light emitting efficiency. In addition, although the present invention is described with an n-type doped layer being formed on the transparent layer, and a p-type doped layer being formed on the active layer, the present invention is also applicable with the conductive type of the doped layers being exchanged. That is, a p-type doped layer may be formed on the transparent layer, and an n-type doped layer is formed on the active layer.

The disclosed semiconductor may have p-electrodes and n-electrodes arranged alternately thereon and the distance between each p-electrode and its adjacent n-electrodes is substantially constant, and the distance between every two p-electrodes (or n-electrodes) is substantially constant. The disclosed semiconductor can be served as an assembly of numerous parallel sub-dies, each of which has an equal current flux while each sub-die has equal inner resistance and equal potential difference. Therefore, the disclosed semiconductor and the method for forming the same may effectively improve the current diffusion and current distribution. As a result, the disclosed system may improve the brightness and the light emission efficiency of LED devices.

It will be apparent to those skilled in the art that various modifications and variations can be made in the disclosed apparatus and method without departing from the scope of the disclosure. Additionally, other embodiments of the disclosed apparatus and method will be apparent to those skilled in the art from consideration of the specification. It is intended that the specification and examples be considered as exemplary only, with a true scope of the disclosure being indicated by the following claims and their equivalents.

What is claimed is:

1. A semiconductor, comprising:
   a transparent layer having a first surface;
   a first doped layer formed over the first surface of the transparent layer, wherein the first doped layer has a plurality first-type metal electrodes formed thereon;
   a second doped layer formed over the first surface of the transparent layer, wherein the second doped layer has a plurality of second-type metal electrodes formed thereon; and
   an active layer formed over the first surface of the transparent layer and disposed between the first doped layer and the second doped layer,
   wherein the first-type metal electrodes and the second-type metal electrodes are alternately arranged such that each first-type metal electrode is surrounded by at least four adjacent second-type metal electrodes, wherein the distances between each first-type metal electrode and the at least four adjacent second-type metal electrodes are substantially equal.

2. The semiconductor of claim 1, wherein the first doped layer, the second doped layer and the active layer are comprised of a semiconductor material of a III-V group compound.

3. The semiconductor of claim 2, wherein the first doped layer is an n-GaN layer, and wherein the second doped layer is a p-GaN layer.

4. The semiconductor of claim 1, wherein current distributions at each first-type metal electrode are substantially uniform.

5. The semiconductor of claim 1, wherein current distributions at each second-type metal electrode are substantially uniform.

6. The semiconductor of claim 1, wherein the potential differences between the first-type metal electrode and the second-type metal electrode in the electrode pairs are substantially equal.

7. The semiconductor of claim 6, wherein each first-type metal electrode has a first equal potential and each second-type metal electrode has a second equal potential.

8. The semiconductor of claim 1, further comprising a first metal wire path formed on the first doped layer for connecting at least two first-type metal electrodes, and a second metal wire path formed on the second doped layer for connecting at least two second-type metal electrodes.

9. The semiconductor of claim 1, wherein the area of each first-type metal electrode is substantially equal to the area of the each second-type metal electrode.

10. The semiconductor of claim 1, wherein the semiconductor is a light-emitting diode.

11. The semiconductor of claim 1, wherein the transparent layer comprises a sapphire substrate.

12. The semiconductor of claim 1, wherein the active layer comprises at least one multi-quantum well.

13. A flip-chip light emitting diode package structure, comprising:
    a package substrate; and
    a light emitting diode device comprising:
    a transparent layer having a first surface and a second surface opposite to the first surface;
    a first doped layer formed over the first surface of the transparent layer, wherein the first doped layer has a plurality of first-type metal electrodes formed thereon; a second doped layer formed over the first surface of the transparent layer, wherein the second doped layer has a plurality of second-type metal electrodes formed thereon; and
    an active layer formed over the first surface of the transparent layer and disposed between the first doped layer and the second doped layer,
    wherein the first-type metal electrodes and the second-type metal electrodes are alternately arranged such that each first-type metal electrode is surrounded by at least four adjacent second-type metal electrodes, wherein the distances between each first-type metal electrode and the at least four adjacent second-type metal electrodes are substantially equal,
    wherein the light emitting diode device is faced-down and flipped on the package substrate with the second surface of the transparent layer facing away from the package substrate and the light emitting diode device is electrically connected to the package substrate through the first-type metal electrodes and the second-type metal electrodes.

14. The flip-chip light emitting diode package structure of claim 13, further comprising a metal bump layer and a pad layer formed between the package substrate and the second doped layer, providing current conduction paths and heat dissipation paths between the package substrate and the second doped layer.

15. A method for forming a semiconductor, comprising:
    providing a transparent layer having a first surface;
    forming a first doped layer over the first surface of the transparent layer, wherein the first doped layer has a plurality of first-type metal electrodes formed thereon;
    forming an active layer over the first surface of the transparent layer; and
    forming a second doped layer over the first surface of the transparent layer, wherein the second doped layer has a plurality of second-type metal electrodes formed thereon,
    wherein the first-type metal electrodes and the second-type metal electrodes are alternately arranged such that each first-type metal electrode is surrounded by at least four adjacent second-type metal electrodes, wherein the distances between each first-type metal electrode and the at least four adjacent second-type metal electrodes are substantially equal.

16. The method of claim 15, wherein the first doped layer, the second doped layer and the active layer are comprised of a semiconductor material of a III-V group compound.

17. The method of claim 16, wherein the first doped layer is an n-GaN layer, and wherein the second doped layer is a p-GaN layer.

18. The method of claim 15, further comprising forming a first metal wire path on the first doped layer for connecting at least two first-type metal electrodes, and a second metal wire path formed on the second doped layer for connecting at least two second-type metal electrodes.

19. The method of claim 15, further comprising:
    providing a package substrate;
    flipping the semiconductor on the package substrate with the second surface of the transparent layer facing away from the package substrate; and
    electrically connecting the semiconductor to the package substrate through the first-type metal electrodes and the second-type metal electrodes.

20. The method of claim 19, further comprising:
    forming a metal bump layer and a pad layer between the package substrate and the second doped layer, wherein each of the metal bump layer and the pad layer provides current conduction paths and heat dissipation paths between the package substrate and the second doped layer.

* * * * *

UNITED STATES PATENT AND TRADEMARK OFFICE
CERTIFICATE OF CORRECTION

PATENT NO. : 7,952,106 B2
APPLICATION NO. : 12/422027
DATED : May 31, 2011
INVENTOR(S) : Chin-Yuan Hsu Page 1 of 1

It is certified that error appears in the above-identified patent and that said Letters Patent is hereby corrected as shown below:

Claim 13, col. 9, lines 37-38, insert paragraph break between "formed thereon;" and "a second doped layer".

Claim 13, col. 9, line 48, "adiacent" should read --adjacent--.

Signed and Sealed this
Sixth Day of September, 2011

David J. Kappos
*Director of the United States Patent and Trademark Office*